United States Patent
Priel et al.

(10) Patent No.: US 7,962,805 B1
(45) Date of Patent: Jun. 14, 2011

(54) SYSTEM AND METHOD FOR PREVENTING A RACE CONDITION

(75) Inventors: Michael Priel, Herzeliya (IL); Dan Kuzmin, Givat Shumel (IL); Anton Rozen, Gedera (IL)

(73) Assignee: Freescale Semiconductor, Inc., Austin, TX (US)

( * ) Notice: Subject to any disclaimer, the term of this patent is extended or adjusted under 35 U.S.C. 154(b) by 382 days.

(21) Appl. No.: 12/026,595

(22) Filed: Feb. 6, 2008

(51) Int. Cl.
*G06F 11/00* (2006.01)

(52) U.S. Cl. .................................................... 714/704

(58) Field of Classification Search .................. None
See application file for complete search history.

(56) References Cited

U.S. PATENT DOCUMENTS

| | | | |
|---|---|---|---|
| 6,032,278 A * | 2/2000 | Parvathala et al. ............. | 714/726 |
| 6,185,720 B1 * | 2/2001 | Banik ................................ | 716/2 |
| 6,389,566 B1 | 5/2002 | Wagner et al. | |
| 6,753,714 B2 * | 6/2004 | Gupta ............................... | 327/202 |
| 7,234,088 B2 * | 6/2007 | Gass ................................. | 714/725 |
| 2002/0078410 A1 * | 6/2002 | Matsushima .................. | 714/726 |
| 2004/0015759 A1 | 1/2004 | Chen et al. | |
| 2006/0028259 A1 * | 2/2006 | Aksamit ........................ | 327/202 |
| 2007/0022344 A1 * | 1/2007 | Branch et al. .................. | 714/731 |

* cited by examiner

*Primary Examiner* — Jeffrey A Gaffin
*Assistant Examiner* — Guerrier Merant (57) ABSTRACT

A system that includes a first flip flop that is serially coupled to a second flip flop. The first flip flop includes a transfer circuit that is coupled between a master latch and a slave latch. The master latch of the first flip flop latches a scan data signal during a first portion of a cycle of a first clock signal that is provided to the first flip flop. The transfer circuit is conductive during a sub-portion of a second portion of the cycle of the first clock signal. The sub-portion starts after an occurrence of a predefined change in a control signal provided to the slave latch. The predefined change occurs after an estimated start of a first portion of a cycle of a second clock signal that is provided to the second flip flop. A master latch of the second flip flop latches the scan data signal during a first portion of a next cycle of the second clock signal.

20 Claims, 6 Drawing Sheets

PRIOR ART

FIG. 1

PRIOR ART

310 — Latching the scan signal into a master latch of a first flip flop during a first portion of a cycle of a first clock signal. The scan signal is supplied to a scan input of the first flip flop and the first clock signal is supplied to a clock input of the first flip flop.

320 — Latching the scan signal into a slave latch of the first flip flop during a sub-portion of a second portion of the cycle of the first clock signal. The sub-portion starts after an occurrence of a predefined change in a control signal provided to the slave latch of the first flip flop. The predefined change occurs after an estimated start of a first portion of a cycle of a second clock signal that is provided to a second flip flop.

330 — Latching the scan signal into a master latch of the second flip flop during a next cycle of the second clock signal.

SYSTEM AND METHOD FOR PREVENTING A RACE CONDITION

FIELD OF THE INVENTION

The present invention relates to a system and a method for preventing a race condition.

BACKGROUND OF THE INVENTION

Modern integrated circuits include a very large amount of logic circuits such as flip-flops, logic gates and the like. These circuits are tested in various manners, in order to provide an indication about the functionality of the integrated circuit.

Integrated circuit designers are forced to use relatively limited resources (such as dedicated test pins, silicone footprint) in order to perform complex tests.

One common method for checking an integrated circuit involves connecting multiple scan logic circuits in a serial manner, such as to form a very long scan chain. A typical scan logic circuit can operate in a functional mode and in scan mode. In scan mode scan data propagates along the scan chain, from one scan logic circuit to another scan logic circuit. In functional mode data propagates between logic circuits in paths that differ from the scan data paths.

Signals, such as clock signals and data signals propagate differently during scan mode and functional mode, as they travel through different paths. A clock signal can be skewed and even dramatically skewed in one mode while being substantially un-skewed in the other operational mode.

Clock skews can cause timing violations such as setup or hold violations. These violations can cause scan data to be corrupted and even force a scan logic circuit to enter an unknown logical state.

A race (also referred to as a race condition) occurs when the timing differences between clock signals that arrive to different components results in timing violations, and especially when a certain scan flip flop samples irrelevant information. A race condition is illustrated in FIG. 1 and FIG. 2.

Figure 1:
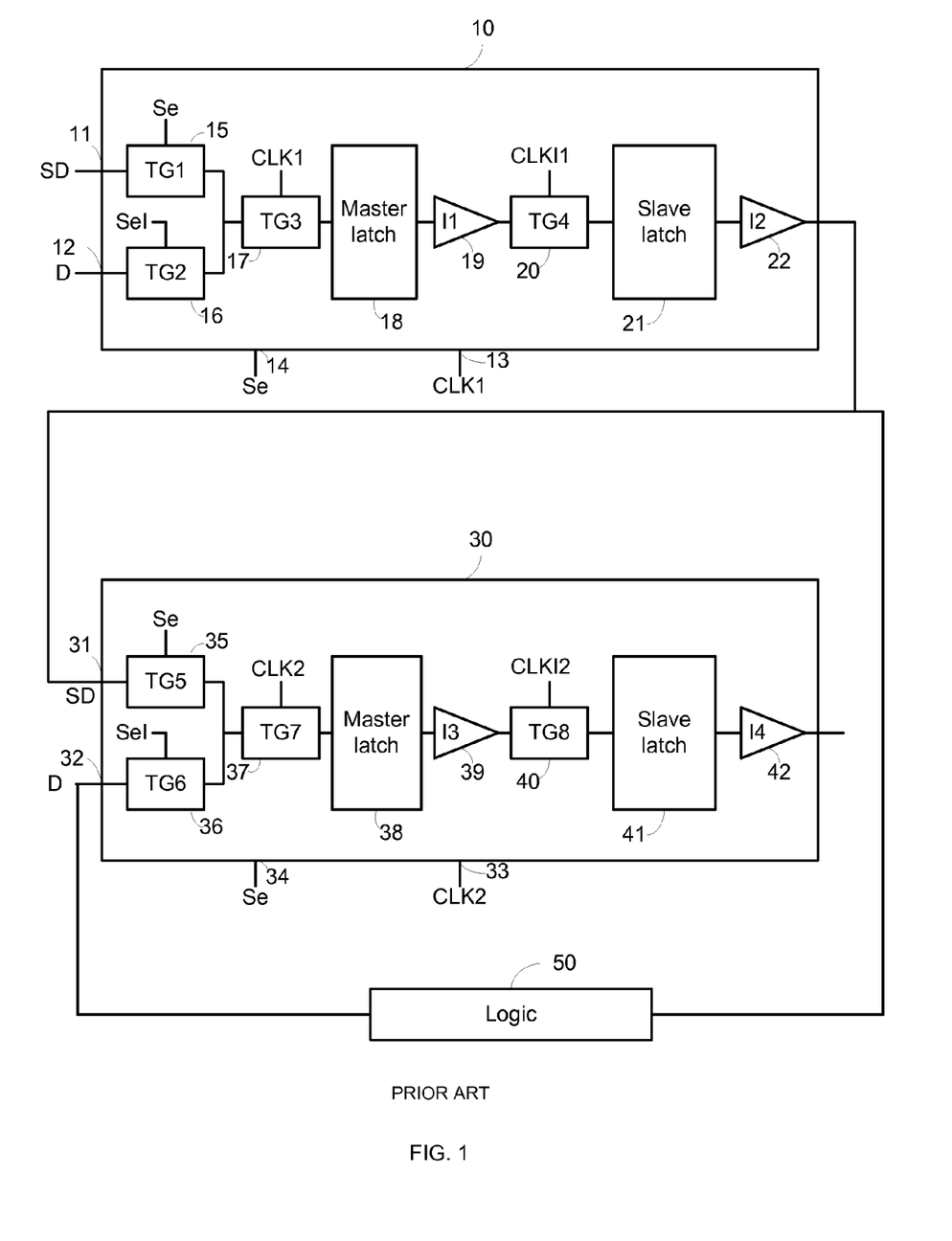
FIG. 1 is a schematic diagram of prior art flip flops.
Figure 2:
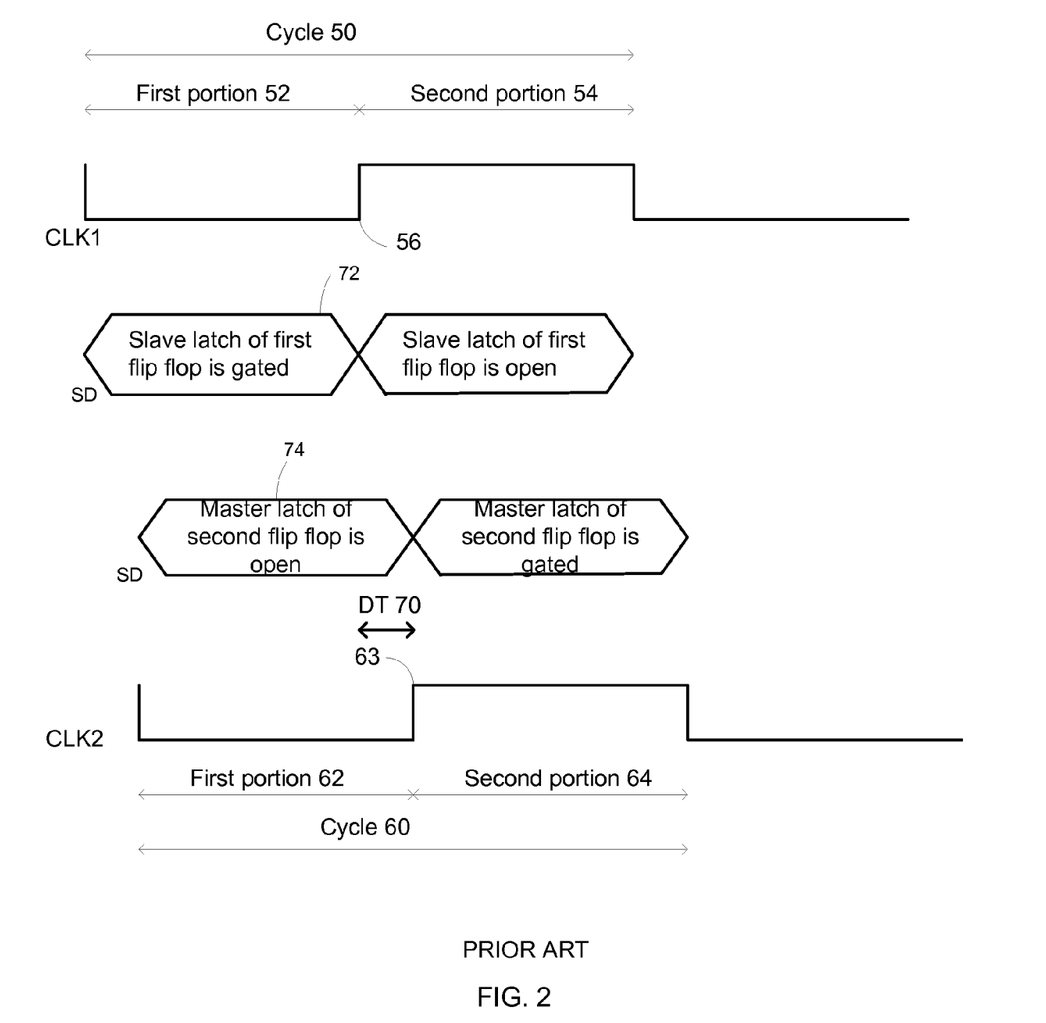
FIG. 2 is a timing diagram illustrating a race condition in prior art.

FIG. 1 is a schematic diagram of prior art flip flops 10 and 30 and of logic 50. During a functional (also referred to as normal or no scan) mode data that is outputted from launch flip flop 10 passes through logic 50 before being received by capture flip flop 30. During a scan mode a scan data signal is sent directly from launch flip flop 10 to capture flip flop 30.

Launch flip flop 10 includes scan data input 11, data input 12, clock input 13, scan enable input 14, first transfer gate (TG1) 15, second transfer gate (TG2) 16, third transfer gate (TG3) 17, master latch 18, first inverter (I1) 19, fourth transfer gate (TG4) 20, slave latch 21 and second inverter (I2) 22. Master latch 18 is a master latch of launch flip flop 10. Slave latch 21 is a slave latch of launch flip flop 10.

Each transfer gate out of transfer gates 15, 16, 17 and 20 has non-inverted and inverted control inputs and first and second terminals. Signals received by the non-inverted and inverted control inputs are complements of each other. When the non-inverted control input has a predefined value a conductive path is formed between the first and second terminals of the transfer gate. For simplicity of explanation only the non-inverted control inputs are illustrated.

The first terminal of first transfer gate 15 is coupled to scan data (SD) input 11. The second terminal of first transfer gate 15 and a second terminal of second transfer gate 16 are coupled to a first terminal of third transfer gate 17. The first terminal of second transfer gate 16 is coupled to data input (D) 12. The second terminal of third transfer gate 17 is coupled to an input terminal of master latch 17. An output terminal of master latch 17 is coupled to an input of first inverter 18. An output of first inverter 18 is coupled to a first terminal of fourth transfer gate 19. A second terminal of fourth transfer gate 19 is coupled to an input terminal of slave latch 20. An output terminal of slave latch 20 is coupled to an input of second inverter 21. The output of second inverter 21 forms the output of first launch flip flop 10.

A non-inverted control gate of first transfer gate 15 receives scan enable signal (Se) from scan enable (Se) input 14. The non-inverted control gate of second transfer gate 16 receives an inverted scan enable signal (Sel). The non-inverted control gate of third transfer gate 16 receives a first clock signal (CLK1) from clock input 13. The non-inverted control gate of fourth transfer gate 19 receives an inverted first clock signal (CLKI1). For simplicity of explanation the inversion of various signals are not shown.

During scan mode, scan enable signal Se is high, causing first transfer gate 15 to conduct and cause second transfer gate 16 not to conduct. Accordingly, scan data from scan data input 11 is provided to the first terminal of third transfer gate 17. Third transfer gate 17 is conductive and fourth transfer gate 20 is not conductive during a first portion of a cycle of first clock signal CLK1. Accordingly, scan data is latched into master latch 18 during the first portion of the cycle of the first clock signal CLK1.

Third transfer gate 17 is not conductive and fourth transfer gate 20 is not conductive during a second portion of the cycle of first clock signal CLK1. Accordingly, scan data that was previously latched into master latch 18 is being latched into slave latch 21 during the second portion of the cycle of the first clock signal CLK1.

Capture flip flop 30 includes scan data input 31, data input 32, clock input 33, scan enable input 34, fifth transfer gate (TG5) 35, sixth transfer gate (TG6) 36, seventh transfer gate (TG7) 37, master latch 38, third inverter (I3) 39, eighth transfer gate (TG8) 40, slave latch 41 and fourth inverter (I4) 42. Master latch 38 is a master latch of capture flip flop 30. Slave latch 41 is a slave latch of capture flip flop 30.

Each transfer gate out of transfer gates 35, 36, 37 and 40 has non-inverted and inverted control inputs and first and second terminals. Signals received by the non-inverted and inverted control inputs are complements of each other. When the non-inverted control input has a predefined value a conductive path is formed between the first and second terminals of the transfer gate.

The first terminal of fifth transfer gate 35 is coupled to scan data input 11. The second terminal of fifth transfer gate 35 and a second terminal of sixth transfer gate 36 are coupled to a first terminal of seventh transfer gate 37. The first terminal of sixth transfer gate 36 is coupled to data input 32. The second terminal of seventh transfer gate 37 is coupled to an input terminal of master latch 38. An output terminal of master latch 38 is coupled to an input of third inverter 39. An output of third inverter 39 is coupled to a first terminal of eighth transfer gate 40. A second terminal of eighth transfer gate 40 is coupled to an input terminal of slave latch 41. An output terminal of slave latch 41 is coupled to an input of second inverter 21. The output of fourth inverter 42 forms the output of capture flip flop 30.

The non-inverted control gate of fifth transfer gate 35 receives scan enable signal Se from scan enable input 34. The non-inverted control gate of sixth transfer gate 36 receives an inverted scan enable signal Sel. The non-inverted control gate of seventh transfer gate 37 receives a second clock signal CLK2 from clock input 33. The non-inverted control gate of eighth transfer gate 40 receives an inverted second clock signal CLKI2. For simplicity of explanation the inversion of the second clock signal and the scan enable signal are not shown.

During scan mode, scan enable signal Se is high, causing fifth transfer gate 35 to conduct and causing sixth transfer gate 36 not to conduct. Accordingly, scan data (previously stored at launch flip flop 10) from scan data input 31 is provided to the first terminal of seventh transfer gate 37. Seventh transfer gate 37 is conductive and eighth transfer gate 40 is not conductive during a first portion of a cycle of second clock signal CLK2. Accordingly, scan data is latched into master latch 38 during the first portion of the cycle of the second clock signal CLK2.

Seventh transfer gate 37 is not conductive and eighth transfer gate 40 is not conductive during a second portion of the cycle of second clock signal CLK2. Accordingly, scan data that was previously latched into master latch 38 is being latched into slave latch 41 during the second portion of the cycle of the second clock signal CLK2.

A timing difference (also known as skew) can exist between first clock signal CLK1 and second clock signal CLK2. This timing difference can cause a so-called race between launch flip flop 10 and capture flip flop 30. FIG. 2 illustrates an occurrence of a race.

Ideally, first and second clock signals CLK1 and CLK2 are mutually synchronized. In practice, and is illustrated in FIG. 2, a timing difference DT 70 exists between these clock signals. Due to timing difference DT 70 cycle 50 of first clock signal CLK1 ends (at point in time 56) during first portion 62 of cycle 60 of second clock signal CLK2. Between the end (point in time 56) of cycle 60 of first clock signal CLK1 and the end (point in time 63) of first portion 62 of cycle 60 of second clock signal CLK2 both latches (slave latch 21 of launch flip flop 10 and master latch 38 of capture flip flop 30) are opened. Because these flip flops are concurrently open a scan data signal can pass (during the same cycle of first clock signal) from master latch 18 to master latch 38. Thus, an older signal latched in launch flip flop 10 is not latched in capture flip flop 30. The state of slave latch 21 is illustrated by graph 72. The state of master latch 38 is illustrated by graph 74. These graphs illustrate possible values of scan data at the input of each of the respective flip flops 10 and 30. It is noted that a latch is deemed to be gated if is prevented (conveniently by a transfer gate that precedes that latch) from receiving new scan data. A latch is deemed to be open if it can receive scan data (for example—the transfer gate that preceded the latch is conductive).

Race condition can be prevented by adding a delay circuit between launch flip flop 10 and capture flip flop 30, usually done by inserting additional delay cells (buffers, etc). Such a delay is area and power consuming.

There is a need to provide a system and method that can prevent race condition.

SUMMARY OF THE PRESENT INVENTION

The present invention provides a method and a system as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION OF PREFERRED EMBODIMENTS

The following figures illustrate exemplary embodiments of the invention. They are not intended to limit the scope of the invention but rather assist in understanding some of the embodiments of the invention. It is further noted that all the figures are out of scale.

A control signal is provided to a transfer circuit that prevents a race that involves a first flip flop that is coupled to a second flip flop. The timing of a change in the control signal is set so as to prevent a slave latch of the first flip flop and a master latch of the second flip flop to be concurrently open. Conveniently, the control signal is a scan enable signal or a derivative of the scan enable signal. The scan enable signal that is already (regardless of the race prevention mechanism) routed to each flip flop. By using a control signal (scan enable signal) that is already routed to the flip flop the overhead associated with race prevention is greatly reduced.

The scan enable signal is used to select which signal will be provided to a master latch of each flip flop. After the master latch of each flip flop latches the scan data signal the scan enable signal can be used for other purposes.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Figure 3:
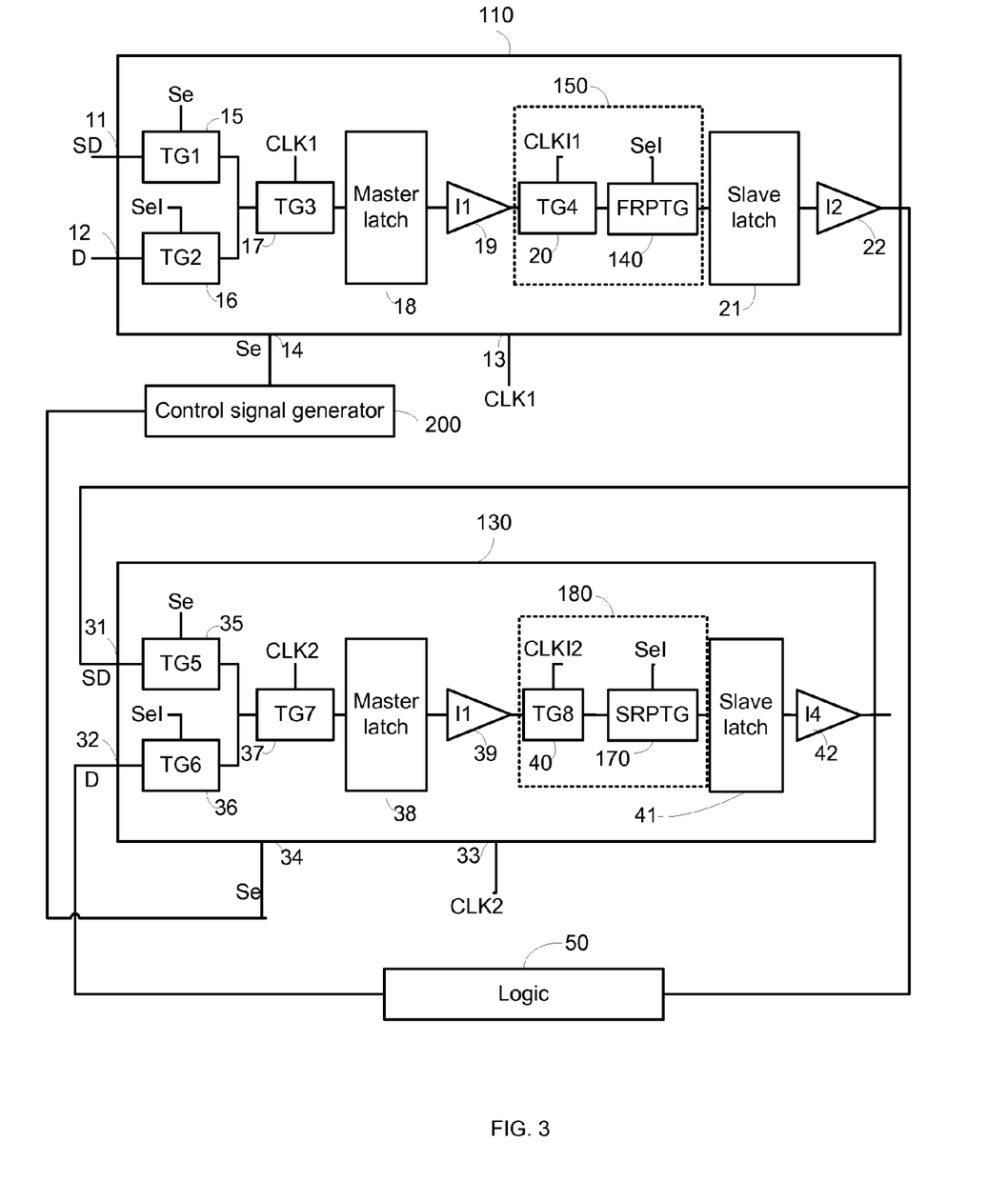
FIG. 3 is a schematic illustration of a system according to an embodiment of the invention.

FIG. 3 illustrates system 100, according to an embodiment of the invention.

System 100 includes first flip flop 110 and second flip flop 130.

First flip flop 110 differs from launch flip flop 10 of FIG. 1 by including another transfer gate that is referred to as first race prevention transfer gate (FRPTG) 140. First race prevention transfer gate 140 is coupled between slave latch 21 and fourth transfer gate 20. Race prevention transfer gate 140 and fourth transfer gate 20 form first launch transfer circuit 150.

First race prevention transfer gate 140 maintains non-conductive until after an estimated start of the first portion of the cycle of the second clock signal CLK2. Accordingly, slave latch 21 remains gated (and stores a previously latched scan data signal) until after the master latch of second flip flop 130 is closed.

First flip flop 110 includes scan data input 11, data input 12, clock input 13, scan enable input 14, first transfer gate 15, second transfer gate 16, third transfer gate 17, first race prevention transfer gate 140, master latch 18, first inverter 19, fourth transfer gate 20, slave latch 21 and second inverter 22.

Each transfer gate out of transfer gates 15, 16, 17, 20 and 140 has non-inverted and inverted control inputs and first and second terminals. Signals received by the non-inverted and inverted control inputs are complements of each other. When the non-inverted control input has a predefined value a conductive path is formed between the first and second terminals of the transfer gate.

The first terminal of first transfer gate 15 is coupled to scan data input 11. The second terminal of first transfer gate 15 and a second terminal of second transfer gate 16 are coupled to a first terminal of third transfer gate 17. The first terminal of second transfer gate 16 is coupled to data input 12. The second terminal of third transfer gate 17 is coupled to an input terminal of master latch 17. An output terminal of master latch 17 is coupled to an input of first inverter 18. An output of first inverter 18 is coupled to a first terminal of fourth transfer gate 19. A second terminal of fourth transfer gate 19 is coupled to a first terminal of first race prevention transfer gate 140. A second terminal of first race prevention transfer gate 140 is coupled to an input terminal of slave latch 20. An output terminal of slave latch 20 is coupled to an input of second inverter 21. The output of second inverter 21 forms the output of first flip flop 110.

The non-inverted control gate of first transfer gate 15 receives scan enable signal Se from scan enable input 14. The non-inverted control gate of second transfer gate 16 receives an inverted scan enable signal Sel. The non-inverted control gate of third transfer gate 16 receives a first clock signal CLK1 clock input 13. The non-inverted control gate of fourth transfer gate 19 receives an inverted first clock signal CLKI1.

The complementary control gate of first race prevention transfer gate 140 receives a control signal such as but not limited to scan enable.

FIG. 3 illustrates the non-inverted control gate of first race prevention transfer gate 140 as receiving an inverted scan enable signal Sel.

First race prevention transfer gate 140 is conductive during a functional mode and during a sub-portion of a second portion of the cycle of the first clock signal. This sub-portion starts after inverted scan enable signal rises. The inverted scan enable signal conveniently falls during the second portion of the cycle of the first clock signal. During the first portion of the cycle of the first clock signal the scan enable signal is high in order to cause master latch 18 to receive a scan data signal and not a data signal. During this first portion first transfer gate 15 and third transfer gate 17 conduct and second transfer gate 16 does not to conduct. Accordingly, scan data from scan data input 11 is provided via first and third transfer gates 15 and 17 to master latch 18 that latches this scan data signal.

This scan data should be latched by master latch 21 during the second portion of the cycle of first clock signal CLK1 and latched by a master latch of second flip flop 130 during a first portion of the next cycle of second clock signal CLK2.

Third transfer gate 17 is not conductive and fourth transfer gate 20 is conductive during a second portion of the cycle of first clock signal CLK1.

Nevertheless, scan data is not transferred from master latch 18 to slave latch 21 until after first race scan prevention transfer gate 140 is opened. Thus, until a predefined change in scan enable signal, such a transfer does not occur and even if the master latch 38 of second flip flop 130 is opened, it does not receive the scan data signal from master latch 18 of first flip flop 110.

The change in the control signal (such as scan enable signal) is timed to occur after an expected start of the estimated start of a first portion of a cycle of a second clock signal that is provided to a second flip flop. The start can be estimated in advance by taking into account various parameters such as the maximal time skew between first and second clock signals CLK1 and CLK2, the temperature of system 100, and the like.

Conveniently, the estimation is executed during the design phase of system 100. The timing of the scan enable signal can also be determined during the design phase of system 100 but this is not necessarily so.

Second flip flop 130 differs from capture flip flop 30 of FIG. 1 by including a further transfer gate that is referred to as second race prevention transfer gate (SRPTG) 170. Second race prevention transfer gate 170 is coupled between slave latch 41 and eighth transfer gate 40. Second race prevention transfer gate 170 and eighth transfer gate 40 form second launch transfer circuit 180.

Second flip flop 130 includes scan data input 31, data input 32, clock input 33, scan enable input 34, fifth transfer gate 35, sixth transfer gate 36, seventh transfer gate 37, master latch 38, third inverter 39, second race prevention transfer gate 170, eighth transfer gate 40, slave latch 41 and fourth inverter 42. Master latch 38 is a master latch of second flip flop 130. Slave latch 41 is a slave latch of second flip flop 130.

Each transfer gate out of transfer gates 35, 36, 37, 40 and 170 has non-inverted and inverted control inputs and first and second terminals. Signals received by the non-inverted and inverted control inputs are complements of each other. When the non-inverted control input has a predefined value a conductive path is formed between the first and second terminals of the transfer gate.

The first terminal of fifth transfer gate 35 is coupled to scan data input 11. The second terminal of fifth transfer gate 35 and a second terminal of sixth transfer gate 36 are coupled to a first terminal of seventh transfer gate 37. The first terminal of sixth transfer gate 36 is coupled to data input 12. The second terminal of seventh transfer gate 37 is coupled to an input terminal of master latch 38. An output terminal of master latch 38 is coupled to an input of third inverter 39. An output of third inverter 39 is coupled to a first terminal of eighth transfer gate 40. A second terminal of eighth transfer gate 40 is coupled to a first terminal of second race prevention transfer gate 170. A second terminal of second race prevention transfer gate 170 is coupled to an input terminal of slave latch 41. An output terminal of slave latch 41 is coupled to an input of second inverter 21. The output of fourth inverter 42 forms the output of second flip flop 130.

The non-inverted control gate of fifth transfer gate 35 receives scan enable signal Se from scan enable input 34. The non-inverted control gate of sixth transfer gate 36 receives an inverted scan enable signal Sel. The non-inverted control gate of seventh transfer gate 37 receives a second clock signal CLK2 from clock input 33. The non-inverted control gate of eighth transfer gate 40 receives an inverted second clock signal CLKI2.

The complementary control gate of first race prevention transfer gate 140 receives a control signal such as but not limited to scan enable.

FIG. 3 illustrates system 100 as including control signal generator 200. It is noted that system 100 can receive a control signal rather than generating such a signal. Control signal generator 200 is adapted to provide the control signal to first flip flop 110. Control signal generator 200 can apply any know prior art methods for generating a control signal. It can be a stateless machine, a state machine, include analog timing circuits or digitally based timing circuits.

Conveniently, control signal generator 200 times the predefined change of the control signal so as to occur after an intermediate period expires from an estimated start of the first portion of the cycle of the second clock signal. This intermediate period can guarantee that the control signal changes after the estimated start of the first portion of the cycle of the second clock signal.

Conveniently, control signal generator 200 times the predefined change of the control signal in response to a maximal expected skew between the first clock signal and the second clock signal.

FIG. 3 illustrates the non-inverted control gate of second race prevention transfer gate 170 as receiving an inverted scan enable signal Sel. For simplicity of explanation both flip flops 110 and 130 were illustrated as receiving the same scan enable signal. It is noted that this is not necessarily so and these each flip flop can receive a scan enable signal that is skewed in relation to a scan enable signal received by another flip flop. Second race prevention gate 170 is designed to prevent a race condition resulting from timing differences between CLK2 and a third clock signal provided to a third flip flop (not shown) that follows second flip flop 130.

During scan mode, scan enable signal Se is high, causing fifth transfer gate 35 to conduct and cause sixth transfer gate 36 not to conduct. Accordingly, scan data (previously stored at first flip flop 110) from scan data input 31 is provided to the first terminal of seventh transfer gate 37. Seventh transfer gate 37 is conductive and eighth transfer gate 40 is not conductive during a first portion of a cycle of second clock signal CLK2. Accordingly, scan data is latched into master latch 38 during the first portion of the cycle of the second clock signal CLK2.

Seventh transfer gate 37 is not conductive and eighth transfer gate 40 is not conductive during a second portion of the cycle of second clock signal CLK2. Accordingly, scan data that was previously latched into master latch 38 is being latched into slave latch 41 during the second portion of the cycle of the second clock signal CLK2.

It is noted that if race should be prevented between more than two flip flops then the control signals provided to each of these flip-flops should be timed according to an expected skew between clock signals provided to each pair of consecutive flip-flops. Those of skill in the art will appreciate that timing differences can occur between control signals provided to different flip flops.

Figure 4:
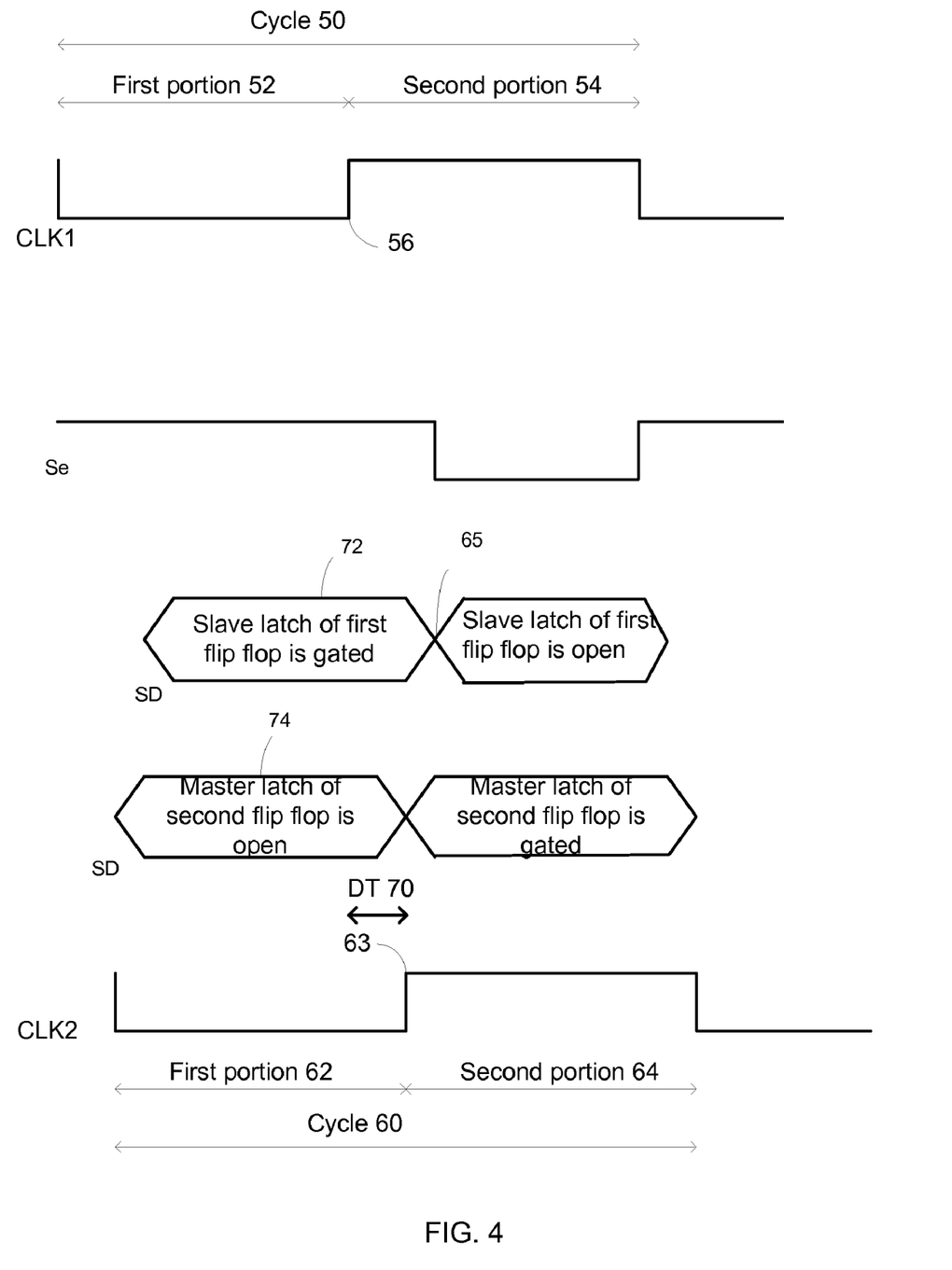
FIG. 4 is a timing diagram according to an embodiment of the invention.

FIG. 4 is a timing diagram that illustrates how a race is prevented, according to an embodiment of the invention.

Due to timing difference DT 70 cycle 50 of first clock signal CLK1 ends (at point in time 56) during first portion 62 of cycle 60 of second clock signal CLK2. Between the end of cycle 60 of first clock signal CLK1 and the end (point in time 63) of first portion 62 of cycle 60 of second clock signal CLK2 slave latch 21 is opened. Slave latch 21 is closed at point in time 65—at the end of first portion 62 of cycle 60 of second clock signal CLK2. Only after point in time 65 scan enable signal is asserted and master latch 34 is opened. Scan enable signal is negated during second period 64 of cycle 60 of second clock signal CLK2. The state of slave latch 21 of first flip flop 110 is illustrated by graph 72. The state of master latch 38 of second flip flop 130 is illustrated by graph 74. These graphs illustrate possible values of scan data at the input of each of the respective flip flops 110 and 130.

Figure 5:
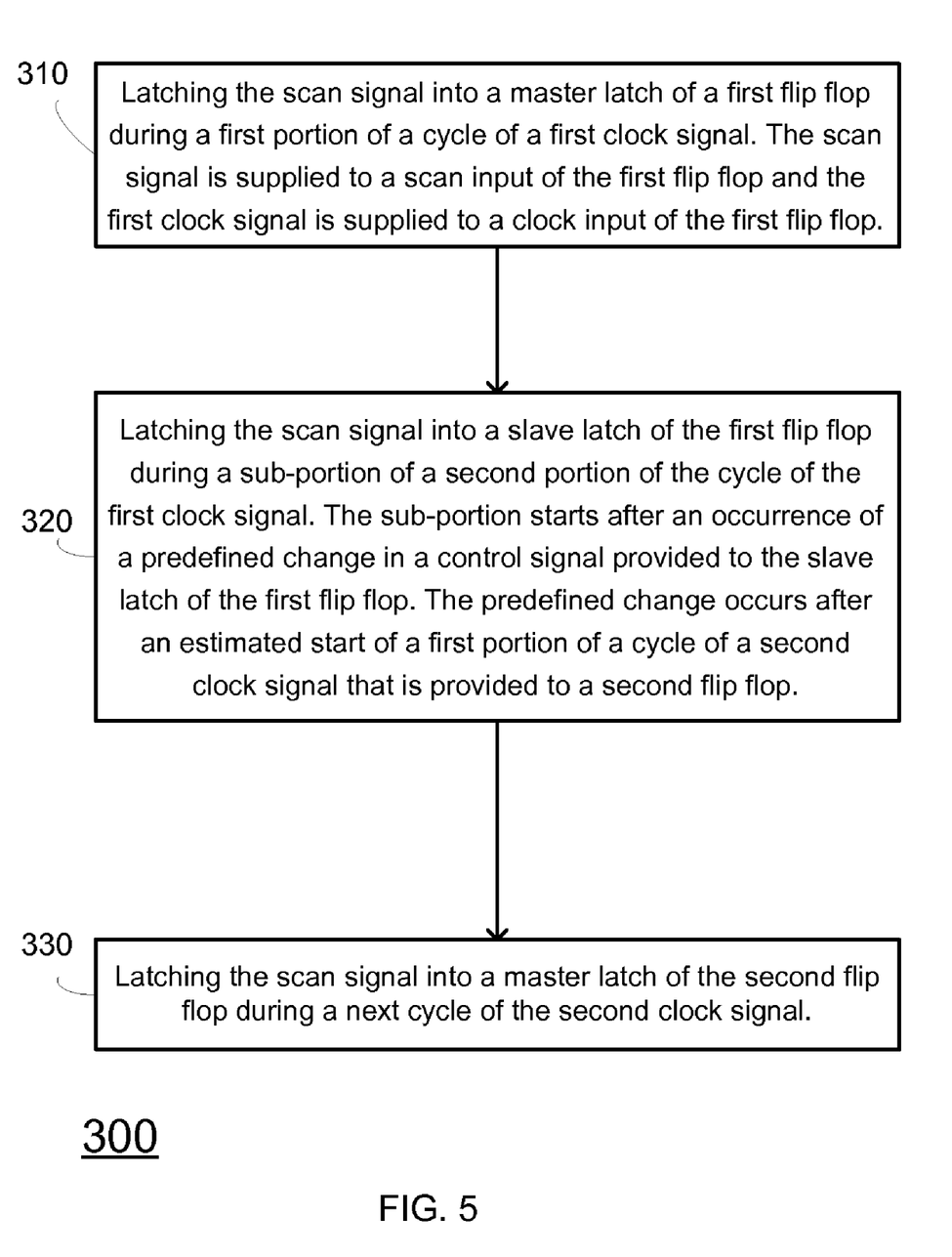
FIG. 5 is a flow chart of a method for preventing a race condition according to an embodiment of the invention.

FIG. 5 illustrates method 300 for preventing a race condition according to an embodiment of the invention.

Method 300 starts by stage 310 of latching the scan data signal into a master latch of a first flip flop during a first portion of a cycle of a first clock signal. The scan data signal is supplied to a scan input of the first flip flop and the first clock signal is supplied to a clock input of the first flip flop.

Stage 310 is followed by stage 320 of latching the scan data signal into a slave latch of the first flip flop during a sub-portion of a second portion of the cycle of the first clock signal. The sub-portion starts after an occurrence of a predefined change in a control signal provided to the slave latch of the first flip flop. The predefined change occurs after an estimated start of a first portion of a cycle of a second clock signal that is provided to a second flip flop.

Conveniently, stage 320 includes providing the scan data signal to a transfer circuit that is coupled between the master latch of the first flip flop and the slave latch of the first flip flop. The transfer circuit includes a first transfer gate that is serially coupled to a second transfer gate. The first transfer gate is conductive during the second portion of the cycle of the first clock signal. The second transfer gate is conductive after the occurrence of the predefined change of the control signal and until a next change of the control signal. Conveniently, the next change of the control signal occurs during the second portion of the cycle of the first clock signal. It is noted that both transfer gates can be combined to provide a single transfer gate with a combined control.

Conveniently, the control signal is a scan enable signal.

Stage 320 is followed by stage 330 of latching the scan data signal into a master latch of the second flip flop during a next cycle of the second clock signal.

Figure 6:
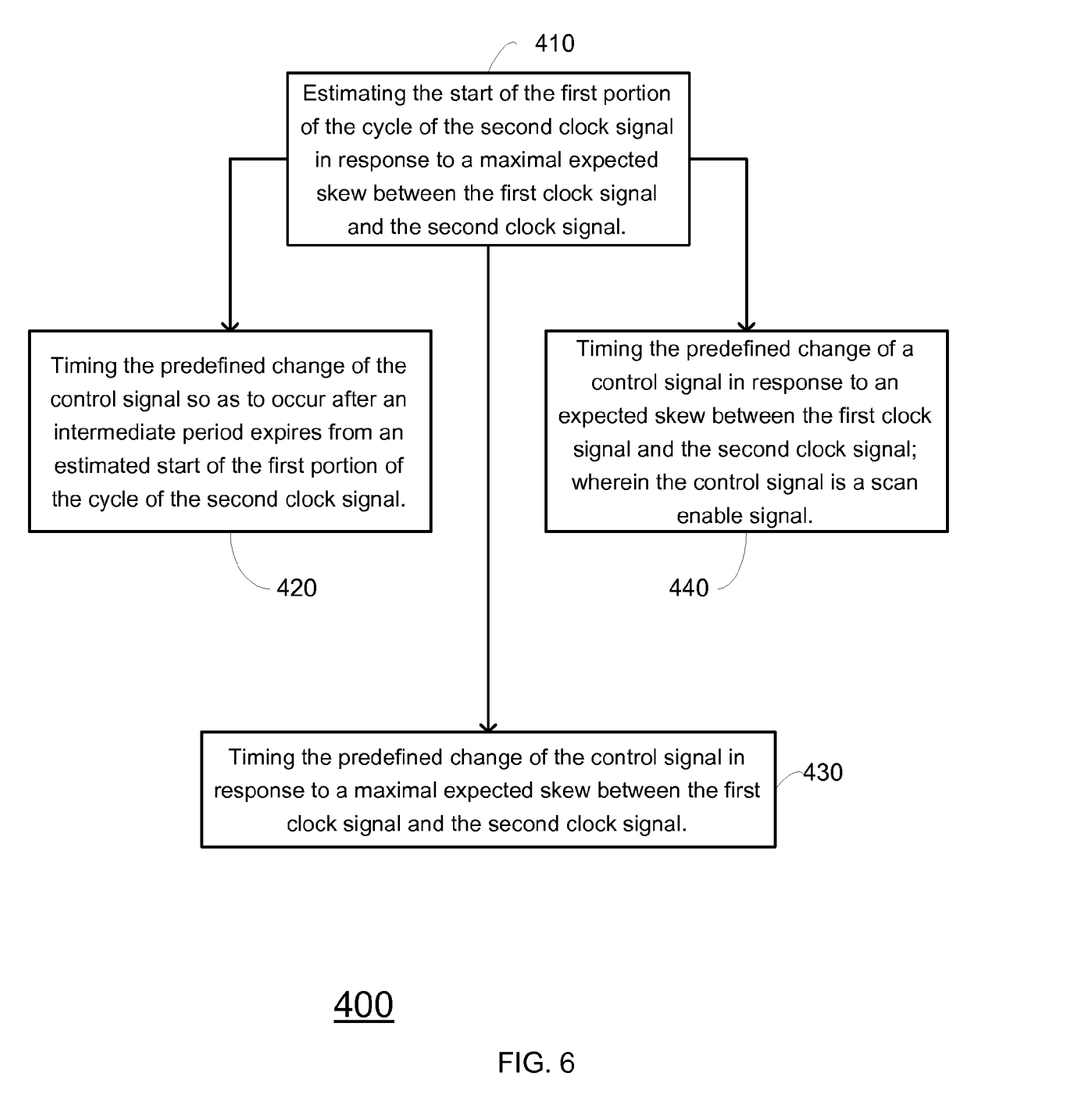
FIG. 6 is a flow chart of a method for preventing a race condition according to another embodiment of the invention.

FIG. 6 illustrates method 400 for preventing a race condition according to another embodiment of the invention.

Method 400 starts by stage 410 of estimating the start of the first portion of the cycle of the second clock signal in response to a maximal expected skew between the first clock signal and the second clock signal.

Stage 410 is followed by either one of optional stages 420, 430 and 440.

Stage 420 includes timing the predefined change of the control signal so as to occur after an intermediate period expires from an estimated start of the first portion of the cycle of the second clock signal.

Stage 430 includes timing the predefined change of the control signal in response to a maximal expected skew between the first clock signal and the second clock signal.

Stage 440 includes timing the predefined change of a control signal in response to an expected skew between the first clock signal and the second clock signal; wherein the control signal is a scan enable signal.

Referring to the example set fourth in previous drawings, method 400 can be executed by system 100 and especially by control signal generator 200. Alternatively, these stages are executed by another system than provides timing information to control signal generator 200. Stages 410, 420, 430 and 440 can be executed during a design phase of system 100 but this is not necessarily so. The estimation and timing of the control signal can vary during the lifespan of system 100. For example, temperature changes can alter the timing estimation. An estimation of the temperature of system 100 can be followed by updated the timing of the control signal.

It is noted that the stages of method 300 and 400 can be combined. For example, stage 410 and one stage out of stages 420, 430 and 440 are followed by stages 310, 320 and 330.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

The description relates to a scan mode and a functional mode. Those of skill in the art will appreciate that the following methods and systems can be applied to two operational modes that substantially differ from each other by the functionality (and hence connectivity of their components) and their operational speed. The frequency of a clock signal provided during a first operational mode substantially differs from the frequency of the same clock signal when provided during the second operational mode. During a first operational mode multiple signals pass through different paths than the paths they propagate through during the second operational mode. The scan mode can be regarded as a first operational mode while the functional mode can be regarded as a second operational mode. Scan data can be regarded as data provided during a first operational mode while normal data can be provided during the second operational mode. Accordingly a method is provided, the method includes: (i) latching a first operational mode data signal into a master latch of a first flip flop during a first portion of a cycle of a first clock signal; wherein the scan data signal is supplied to a first operational mode data input of the first flip flop and the first clock signal is supplied to a clock input of the first flip flop; (ii) latching the first operational mode data signal into a slave latch of the first flip flop during a sub-portion of a second portion of the cycle of the first clock signal; wherein the sub-portion starts after an occurrence of a predefined change in a control signal provided to the slave latch of the first flip flop; wherein the predefined change occurs after an estimated start of a first portion of a cycle of a second clock signal that is provided to a second flip flop; and latching the first operational mode data signal into a master latch of the second flip flop during a next cycle of the second clock signal.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

We claim:

1. A method for preventing a race condition, the method comprising the stages of:

latching a scan data signal into a master latch of a first flip flop during a first portion of a cycle of a first clock signal; wherein the scan data signal is supplied to a scan data input of the first flip flop and the first clock signal is supplied to a clock input of the first flip flop;

latching the scan data signal into a slave latch of the first flip flop during a sub-portion of a second portion of the cycle of the first clock signal; wherein the sub-portion starts after an occurrence of a predefined change in a control signal provided to the slave latch of the first flip flop; wherein the predefined change occurs after an estimated start of a second portion of a cycle of a second clock signal that is provided to a second flip flop; and latching the scan data signal into a master latch of the second flip flop during a next cycle of the second clock signal.

2. The method according to claim 1 comprising providing the scan data signal to a transfer circuit that is coupled between the master latch of the first flip flop and the slave latch of the first flip flop; wherein the transfer circuit comprises a first transfer gate that is serially coupled to a second transfer gate; wherein the first transfer gate is conductive during the second portion of the cycle of the first clock signal and the second transfer gate is conductive after the occurrence of the predefined change of the control signal and until a next change of the control signal.

3. The method according to claim 2 wherein the next change of the control signal occurs during the second portion of the cycle of the first clock signal.

4. The method according to claim 1 wherein the control signal is a scan enable signal.

5. The method according to claim 4 comprising providing the scan data signal to a transfer circuit that is coupled between the master latch of the first flip flop and the slave latch of the first flip flop; wherein the transfer circuit comprises a first transfer gate that is serially coupled to a second transfer gate; wherein the first transfer gate is conductive during the second portion of the cycle of the first clock signal and the second transfer gate is conductive after an occurrence of a predefined change of the scan enable signal and until a next change of the scan enable signal.

6. The method according to claim 5 wherein the next change of the scan enable signal occurs during the second portion of the cycle of the first clock signal.

7. The method according to claim 1 comprising estimating the start of the second portion of the cycle of the second clock signal in response to a maximal expected skew between the first clock signal and the second clock signal.

8. The method according to claim 1 comprising timing the predefined change of the scan control signal so as to occur after an intermediate period expires from an estimated start of the second portion of the cycle of the second clock signal.

9. The method according to claim 1 comprising timing the predefined change of the control signal in response to a maximal expected skew between the first clock signal and the second clock signal.

10. The method according to claim 1 comprising timing the predefined change of a control signal in response to an expected skew between the first clock signal and the second clock signal; wherein the control signal is a scan enable signal.

11. A system comprising a first flip flop that is serially coupled to a second flip flop;

wherein the first flip flop comprises a transfer circuit that is coupled between a master latch and a slave latch;

wherein the master latch of the first flip flop latches a scan data signal during a first portion of a cycle of a first clock signal that is provided to the first flip flop;

wherein the transfer circuit is conductive during a sub-portion of a second portion of the cycle of the first clock signal; wherein the sub-portion starts after an occurrence of a predefined change in a control signal provided to the slave latch;

wherein the predefined change occurs after an estimated start of a second portion of a cycle of a second clock signal that is provided to the second flip flop;

wherein a master latch of the second flip flop latches the scan data signal during a first portion of a next cycle of the second clock signal.

12. The system according to claim 11 wherein the transfer circuit comprises a first transfer gate that is serially coupled to a second transfer gate; wherein the first transfer gate is conductive during the second portion of the cycle of the first clock signal and the second transfer gate is conductive after the occurrence of the predefined change of the control signal and until a next change of the control signal.

13. The system according to claim 12 wherein the next change of the control signal occurs during the second portion of the cycle of the first clock signal.

14. The system according to claim 11 wherein the control signal is a scan enable signal.

15. The system according to claim 14 wherein the transfer circuit comprises a first transfer gate that is serially coupled to a second transfer gate; wherein the first transfer gate is conductive during the second portion of the cycle of the first clock signal and the second transfer gate is conductive after the occurrence of the predefined change of a scan enable signal and until a next change of the scan enable signal.

16. The system according to claim 15 wherein the next change of the scan enable signal occurs during the second portion of the cycle of the first clock signal.

17. The system according to claim 11 further comprising a control signal generator that is adapted to provide the control signal to the first flip flop.

18. The system according to claim 17 wherein the control signal generator times the predefined change of the control signal so as to occur after an intermediate period expires from an estimated start of the second portion of the cycle of the second clock signal.

19. The system according to claim 17 wherein the control signal generator times the predefined change of the control signal in response to a maximal expected skew between the first clock signal and the second clock signal.

20. The system according to claim 17 wherein the control signal generator times the predefined change of the control signal in response to an expected skew between the first clock signal and the second clock signal; wherein the control signal is a scan enable signal.

* * * * *